(12) United States Patent
Lolivier et al.

(10) Patent No.: US 7,968,945 B2
(45) Date of Patent: Jun. 28, 2011

(54) MICROELECTRONIC DEVICE PROVIDED WITH TRANSISTORS COATED WITH A PIEZOELECTRIC LAYER

(75) Inventors: Jerome Lolivier, Yermenonville (FR); Maud Vinet, Rives (FR); Thierry Poiroux, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 704 days.

(21) Appl. No.: 11/996,406

(22) PCT Filed: Jun. 21, 2006

(86) PCT No.: PCT/EP2006/064491
§ 371 (c)(1),
(2), (4) Date: Jan. 22, 2008

(87) PCT Pub. No.: WO2007/010029
PCT Pub. Date: Jan. 25, 2007

(65) Prior Publication Data
US 2008/0290384 A1 Nov. 27, 2008

(30) Foreign Application Priority Data

Jul. 22, 2005 (FR) .................................... 05 52279

(51) Int. Cl.
*H01L 29/76* (2006.01)
*H01L 27/148* (2006.01)
(52) U.S. Cl. ........ 257/369; 257/351; 257/368; 257/510; 257/E21.409; 257/E21.633; 257/E27.006; 438/197; 438/199; 438/300; 438/301

(58) Field of Classification Search .................. 257/351, 257/368, 369, 510, E21.409, E21.633, E27.006; 438/197, 199, 300, 301
See application file for complete search history.

(56) References Cited

U.S. PATENT DOCUMENTS

| 5,666,305 | A | 9/1997 | Mihara et al. |
| 5,883,419 | A | 3/1999 | Lee et al. |
| 7,586,158 | B2 * | 9/2009 | Hierlemann et al. ......... 257/369 |
| 7,670,938 | B2 * | 3/2010 | Wu et al. ....................... 438/597 |
| 2002/0105016 | A1 | 8/2002 | Haneder et al. |
| 2002/0125518 | A1 | 9/2002 | Haneder et al. |
| 2004/0251479 | A1 | 12/2004 | Tsutsui et al. |

FOREIGN PATENT DOCUMENTS

| EP | 1 011 149 A2 | 6/2000 |
| JP | 1-120072 | 5/1989 |

(Continued)

OTHER PUBLICATIONS

S. Sinharoy, et al., "Growth and the Microstructural and Ferroelectric Characterization of Oriented BaMgF$_4$ Thin Films", IEEE Transactions on Ultrasonics, Ferroelectrics, and Frequency Control, vol. 38, No. 6, XP-000933807, Nov. 1991, pp. 663-671.

(Continued)

*Primary Examiner* — Dao H Nguyen
(74) *Attorney, Agent, or Firm* — Oblon, Spivak, McClelland, Maier & Neustadt, L.L.P.

(57) ABSTRACT

An improved microelectronic device, and method for making such a microelectronic device. The device includes one or plural transistors and piezoelectric mechanisms, with an arrangement capable of applying a variable mechanical strain on transistor channels.

15 Claims, 8 Drawing Sheets

FOREIGN PATENT DOCUMENTS

| | | |
|---|---|---|
| JP | 4-87376 | 3/1992 |
| JP | 8-181288 | 7/1996 |

OTHER PUBLICATIONS

Xuejue Huang, et al., "Sub 50-nm FinFET: PMOS", 1999 IEEE, IEDM, 1999, pp. 67-70.

B. Doyle, et al., "Tri-Gate Fully-Depleted CMOS Transistors: Fabrication, Design and Layout", 2003 Symposium on VLSI Technology Digest of Technical Papers, 10A-2, 4-89114-033-X, pp. 133-134.

S. Monfray, et al., "50nm—Gate All Around (GAA)—Silicon On Nothing (SON)-Devices: A Simple Way to Co-integration of GAA Transistors within bulk MOSFET process (method)", 2002 Symposium On VLSI Technology Digest of Technical Papers, 11.4, IEEE, 2002, pp. 108-109.

H.S. Jeong, et al., "Highly Manufacturable 4Gb DRAM Using 0.11 µm DRAM Technology", 2000 IEEE, IEDM, 2000, pp. 353-356.

Jing Wang, et al., "Does Source-to-drain tunneling limit the ultimate scaling of MOSFETs?", 2002 IEEE, IEDM, pp. 707-710.

Anisur Rahman, et al., "Assessment of Ge n-MOSFETs by Quantum Simulation", 2003 IEEE, IEDM, 2003, pp. 471-474.

T. Ghani, et al., "A 90nm High Volume Manufacturing Logic Technology Featuring Novel 45nm Gate Length Strained Silicon CMOS Transistors", Electron Devices Meeting, 2003. IEDM '03, IEEE International Volume, Issue, Dec. 8-10, 2003, pp. 978-980.

* cited by examiner

MICROELECTRONIC DEVICE PROVIDED
WITH TRANSISTORS COATED WITH A
PIEZOELECTRIC LAYER

TECHNICAL DOMAIN

This invention relates to the field of integrated circuits and more particularly to transistors, and its purpose is to present a microelectronic device provided with one or several transistors with improved electrical performances, and for which limitations related to the tunnel effect are reduced. This device uses means, and particularly piezoelectric means, capable of inducing a mechanical strain, with a variable nature and/or amplitude, on the channel of these means. These piezoelectric means may be formed above the gates and at least part of the corresponding active zones of the transistors, or between the gates and at least part of the channel structures of the corresponding transistors.

PRIOR ART

It is known that transistor performances in terms of speed and consumption can be improved by forming so-called <<strained>> channels for them, in which the mobility of electrons or holes is improved. The tunnel effect in a channel depends on the tunnel mass of charge carriers and is inversely proportional to the effective conductivity mass of charge carriers. Effective mass carriers with low conductivity tend to facilitate the tunnel current in the channel and improve consumption of transistors in the closed state.

A strained channel is usually formed from a first semiconducting layer onto which a mechanical strain is applied in tension or in compression through at least one second layer subjacent to or located above said semiconducting layer. The second layer may for example be formed from a crystalline semiconducting material with a different lattice parameter from said first semiconducting material, or a dielectric material. In devices made using the CMOS (<<Complementary Metal Oxide Semiconductor >>) technology, nitride-based layers may for example be used to apply a uniaxial tension strain on NMOS transistor channels, while SiGe-based layers made by epitaxy may be used so as to apply a bi-axial compression strain on the PMOS transistor channels. These methods induce an increase in the leakage current when the channels have very small sizes, for example less than 10 nanometers.

Document U.S. Pat. No. 5,883,419 divulges a microelectronic device comprising a transistor with a layer based on a piezoelectric material located between the gate and the transistor channel. The transistor channel is formed from MoC, a metallic and piezo-resistive material, and may be constrained when a voltage is applied on the gate made of a piezoelectric material.

Performances in terms of speed and consumption, and particularly the ratio between the saturation current and the leakage current of such a device are usually insufficient. These performances are based on a change to the resistivity of the channel material. Furthermore, industrial use of such a device is difficult because MoC is an expensive material. Finally, such a device cannot be made using the CMOS technology.

PRESENTATION OF THE INVENTION

The purpose of this invention is to present a microelectronic device comprising means for applying a mechanical strain with a variable type and/or amplitude on the transistor channels.

These means improve transistors, particularly in terms of their electrical performances.

In particular, this invention relates to a microelectronic device comprising:
  a substrate,
  at least one transistor provided with at least one source region, at least one drain region, at least one structure forming at least one channel connecting the source region and the drain region and at least one gate, the device also comprising means, particularly piezoelectric means, supported on at least one portion of gate and above at least one portion of at least one of said source and/or drain regions, capable of inducing a mechanical strain or several different types of mechanical strains on the transistor channel.

Different <<types>> of strains refer to forces that can be induced or that can be applied on the channel by piezoelectric means, in different directions and/or different senses.

The piezoelectric means are capable of inducing at least one first type of strain, for example a tension strain, and at least one second type of mechanical strain, for example a compression strain, on a transistor channel, depending particularly on their bias state.

The piezoelectric type means are capable of inducing at least one first strain with a first intensity, and at least one second mechanical strain with a second intensity different from the first intensity, depending particularly on their bias state.

Said piezoelectric means may comprise at least a thin piezoelectric material-based layer located above at least a portion of the source of said first transistor and supported on at least one portion of the gate of the first transistor.

According to a first variant of the device, the piezoelectric material-based layer and said portion of the source may be separated by an intermediate layer, for example based on an insulating material. According to one possibility, the intermediate layer may be intended to attenuate the mechanical strain applied by the piezoelectric layer. The intermediate layer may also be used as an etching stop layer. The intermediate layer may also be used to electrically isolate the source and the piezoelectric layer.

According to a second variant embodiment of the device, the piezoelectric material-based layer may be supported on the source region and may be in contact with it.

According to one possible embodiment of the microelectronic device, said piezoelectric layer may at least partially cover at least one flank of the gate. Said piezoelectric layer may possibly cover the flanks of the gate and thus act as spacers.

In one possible layout of the piezoelectric layer, this layer may be dissymmetric about a normal to a principal plane of the substrate passing through the gate. This means that a mechanical strain induced by the piezoelectric layer can be concentrated on a given zone of the channel of the first transistor. According to this possible layout, the piezoelectric layer may possibly be located principally or uniquely on the source region and on at least part of the gate of the first transistor. This means that a mechanical strain can be concentrated on the input, or on a zone of the channel of the first transistor located close to the source region.

According to one aspect of the invention, the amplitude and/or the type of mechanical strain induced by the piezoelectric means on the channel of the first transistor may be dependent or may be slaved by the bias state of the first transistor.

The microelectronic device may also include:
at least one first contact or contact pad in contact with the source region that can be connected to means for applying bias to the source region,
at least one second contact or contact pad in contact with the gate and that can be connected to means for applying bias to the gate, the first contact and the second contact being in contact with the piezoelectric layer.

Thus, the amplitude and/or the type of mechanical strain induced by the piezoelectric means on the channel of the first transistor may be dependent or slaved by the bias state of the gate and the source of the first transistor.

According to one variant embodiment of the microelectronic device according to the invention, this device may also comprise:
at least one third contact or third contact pad separate from the piezoelectric layer and that can be connected to means for applying bias to the drain region. Thus, the amplitude and/or type of mechanical strain induced by the piezoelectric means on the channel of the first transistor may be independent of the bias of the drain in the first transistor.

The microelectronic device according to the invention may also comprise:
means for applying bias to the gate,
means for applying bias to the source region,
means for applying bias to the drain region, the means for applying bias to the source region and the means for applying bias to the gate being electrically connected to the piezoelectric layer through the first contact or contact pad and the second contact or contact pad respectively.

The piezoelectric means used according to the invention may be used to apply several different types of strains, consequently they can improve the operation of both PMOS transistors and NMOS transistors, for each of the corresponding <<conducting>> or <<non-conducting>> states that may be adopted by these transistors.

Thus, according to one embodiment of the microelectronic device according to the invention in which the first transistor is a PMOS transistor, this device may also comprise:
at least one second NMOS transistor provided with at least one source region and at least one drain region respectively, formed in second semiconducting zones of the substrate, at least one structure forming a channel, connecting the source region and the drain region and at least one gate supported on the channel,
piezoelectric type means supported on at least one portion of the gate and above at least a portion of at least one of said second semiconducting zones capable of inducing a mechanical strain on the channel of the second transistor.

According to one possible embodiment of the microelectronic device according to the invention, this device can be integrated into a DRAM volatile memory device.

The invention also relates to a microelectronic device comprising:
a substrate,
at least one transistor provided with at least one source region, at least one drain region, at least one semiconducting structure that can form at least one channel connecting the source region and the drain region, and at least one gate, the device also comprising:
piezoelectric type means located under the gate, between the gate and the substrate, the piezoelectric type means being capable of inducing a mechanical strain or several different types of mechanical strains on the transistor channel.

According to one possibility, the piezoelectric means may comprise at least one piezoelectric material-based layer, piezoelectric material-based layer being located between the gate and at least one gate dielectric layer being supported on the channel structure.

According to one variant, the piezoelectric means may comprise at least one piezoelectric material-based layer, the layer based on piezoelectric material being located between at least one gate dielectric layer and the channel structure.

According to one possibility, the piezoelectric means may comprise at least one layer based on piezoelectric material in contact with the gate and the channel structure. According to this possibility, the piezoelectric layer may act as a gate dielectric.

According to one particular embodiment, the piezoelectric means may comprise at least one layer made from semiconducting and piezoelectric material forming part of the channel structure. The semiconducting piezoelectric material may for example be AsGa.

The invention also relates to a method for making a microelectronic device comprising the following steps:
a) formation of at least one first transistor on a substrate, provided with at least one source region, at least one drain region and at least one structure forming a channel, connecting the source region and the drain region and at least one gate on the channel structure, respectively,
b) formation of at least one piezoelectric layer above at least one portion of said source and drain regions and supported on at least one portion of the gate.

According to one possible embodiment of the method, it may also comprise a step c) after step b), for the formation of at least one first conducting pad in contact with the source region and the piezoelectric layer, and that may for example be connected with source bias means, and at least one second conducting pad in contact with the gate and with the piezoelectric layer, and that may for example be connected to gate bias means.

Step c) of the method used to make the microelectronic device may also comprise the formation of at least one third conducting pad in contact with the drain region and advantageously separate or not in contact with the piezoelectric layer, and that may for example be designed to be connected to means for applying bias to the transistor source.

The invention also relates to a method for making a microelectronic device comprising the following steps:
a) formation of at least a first transistor on a substrate, provided with at least one source region and at least one drain region, and at least one semiconducting structure connecting the source region and the drain region,
b) formation of at least one piezoelectric layer above and facing the semiconducting structure,
c) formation of at least one gate above and facing the piezoelectric layer and the semiconducting structure.

According to one possible embodiment of the method, the piezoelectric layer may be based on at least one semiconducting material, for example made of AsGa, and it may be formed on the semiconducting structure, the semiconducting structure and the piezoelectric layer being designed to form a channel for said transistor.

According to one variant, the gate may be formed on the piezoelectric layer.

According to one possibility, the piezoelectric layer may be formed on the semiconducting structure, so as to be in contact with the semiconducting structure.

According to one variant, the method may also include formation of at least one gate dielectric layer prior to step c).

BRIEF DESCRIPTION OF THE DRAWINGS

This invention will be better understood after reading the description of example embodiments given purely for guidance and in no way limitative with reference to the appended drawings on which.

Identical, similar or equivalent parts of the different figures have the same numeric references to facilitate cross-references between one figure and another.

The different parts shown on the figures are not necessarily all shown at the same scale, so that figures are more easily legible.

DETAILED PRESENTATION OF PARTICULAR EMBODIMENTS

Figure 1A:
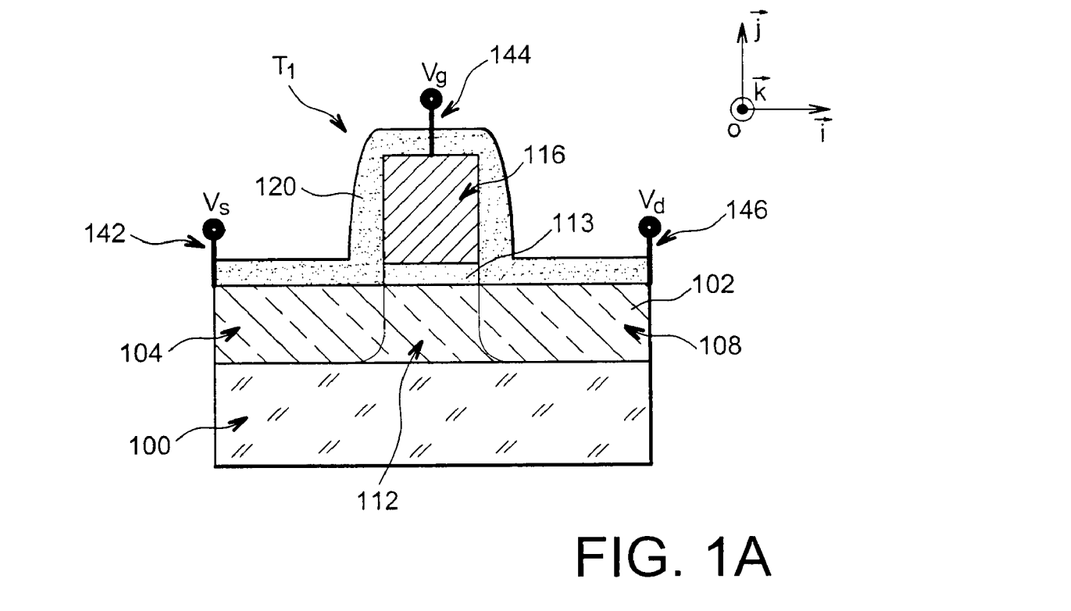
FIGS. 1A and 1B show examples of microelectronic devices according to the invention provided with transistors and piezoelectric means capable of modulating the strained state of the channel of these transistors.

One example of a microelectronic device used according to the invention will now be described with reference to FIG. 1A.

Firstly, this device comprises a substrate 100 that may be of the semiconductor on insulator type, for example of the SOI (Silicon on insulator) type, provided with a first support layer, for example a sapphire-based or semiconducting layer, covered by an insulating layer, for example an $SiO_2$-based layer, itself covered by a semiconducting layer 102 that can act as an active layer. The semiconducting layer 102 may for example be based on at least one semiconducting material among the Si, Ge, SiGe, GaAs materials.

At least one first active zone of a transistor $T_1$, for example made using the MOS (Metal Oxide Semiconductor) technology is formed in the semiconducting layer 102. This first active zone comprises a first doped region capable of acting as a source region 104 of the transistor $T_1$, a second doped region that can act as a drain region 108 of transistor $T_1$, and at least one channel structure 112 connecting the source region 104 and the drain region 108. The transistor $T_1$ also includes at least one gate 116 supported on a dielectric layer 113 of the gate 116. For example, the transistor $T_1$ may be a transistor to write a cell of a DRAM (dynamic random access memory).

The microelectronic device also comprises means, particularly piezoelectric type means, to apply or induce a mechanical strain on the channel structure 112, particularly a variable amplitude and type of strain. <<Amplitude>> refers to an intensity of forces that these piezoelectric means can induce or apply on the channel. <<Type>> means the nature of the forces, for example shear forces or compression forces, or the direction(s) or sense(s) of the forces, that these piezoelectric means can induce or exert on the channel.

Apart from being in a <<rest>> or <<unbiased>> state, these piezoelectric means may apply a first type of force, or induce a first type of stress, for example a tension stress, on the channel structure 112 of the transistor $T_1$, particularly when they are in a first bias state, and are also capable of exerting a second type of force or inducing a second type of stress, for example a compression stress, on the channel structure 112 of transistor $T_1$, when they are in a second bias state different from the first state.

The piezoelectric means may comprise a layer 120 based on a piezoelectric material formed above, for example on the gate 116, and for example on the first active zone. The piezoelectric layer 120 may be arranged so as to at least partially cover the source region 104, and at least partially cover the upper face of the gate 116 of the transistor $T_1$. The piezoelectric layer 120 may possibly be arranged as shown in FIG. 1A, so as to cover the drain region 108 of the transistor $T_1$. The piezoelectric layer 120 may possibly be continuous on the transistor $T_1$ and arranged so as to cover the flanks or sides faces of the gate 116. In this case, in addition to inducing a stress on the channel 112, the layer 120 helps to form spacers for the gate 116.

The piezoelectric layer 120 may be formed on the first active area, particularly on the source region 104 and the drain region 108, and in direct contact with these regions 104, 108.

According to another possibility (not shown), the piezoelectric layer 120 may be formed above the first active area, particularly above the source region 104 and the drain region 108, and may be separated from the source and drain regions by a thin intermediate layer, for example based on an insulating material. This intermediate layer may be intended to attenuate the mechanical strain applied by the piezoelectric layer 120. The intermediate layer may also act as an etching stop layer. According to one possibility, the intermediate layer may also electrically isolate the source and the piezoelectric layer 120. The insulating intermediate layer may for example be based on a thermal oxide TeOS, for example with a thickness of between one nanometer and 15 nanometers. The piezoelectric layer 120 may for example be between one nanometer and 1 micrometer thick, or it may for example be between 10 nanometers and 300 nanometers thick, or its thickness my be such that a stress of the order of 1 GPa or between 0.5 GPa and 5 GPa can be applied. The piezoelectric layer 120 may be based on a piezoelectric material, for example such as $PbZrTiO_3$ or PZT (PZT for lead-zirconate-titanate) or $BaSrTiO_3$ or BST (barium-strontium oxide-titanate), or ZnO or $LiNbO_3$.

The amplitude and the nature of the compression or shear) forces or the tension or compression stress that the layer 120 can exert or induce on the channel structure 112, can be modulated as a function of the manner in which the layer 120 of piezoelectric material is biased.

The device may also include conducting pads 142, 144, 146, in contact with the source region 104, the gate 116 and the drain region 108 respectively of the transistor $T_1$, and inserted in the piezoelectric layer 120. These conducting pads 142, 144, 146 are used to mechanically or electrically connect source bias means, gate bias means, drain bias means (not shown) to the source region, the gate and the drain region respectively. The conducting pads 142, 144, 146, are also used to connect all said bias means to the piezoelectric layer 120.

Depending on the value of the potentials Vs, Vg and Vd applied on the source region 104, the gate 116 and the drain region 108 respectively by the bias means, the piezoelectric layer 120 can deform and apply or induce at least two different types of stresses on the channel 112.

The intensity of the forces or the amplitude of the stress and the sense and/or directions of the forces or the nature of the stress that the layer 120 can apply or induce on the channel 112, may be slaved or modulated by the corresponding potentials Vs, Vg and Vd applied by the bias means on the electrodes of transistor $T_1$.

The device may adopt at least one first bias state or a first state of values for the potentials Vs, Vg, Vd, for which the piezoelectric layer 120 extends and applies or induces a first type of stress on the channel 112 of the transistor $T_1$, for example a tension stress.

The device can also adopt at least one second bias state or a second set of values for the potentials Vs, Vg, Vd for which the piezoelectric layer 120 shrinks or is compressed and applies or induces a second type of stress on the channel 112 of the transistor $T_1$, for example a compression stress.

According to one variant, the drain contact conducting pad 146 may be electrically isolated from the piezoelectric layer 120 using a spacer (not shown) based on an isolating material, for example made of $Si_3N_4$. For this variant, the stress induced by the piezoelectric layer 120 on the channel structure 112 is independent of the potential Vd applied on the drain 108 and is only modulated as a function of the values of potentials Vs and Vg applied by the bias means (not shown) of the source 104 and of the gate 116 of the transistor 110, respectively.

One improved variant of the device described above and illustrated in FIG. 1B, also uses piezoelectric type means to apply a variable mechanical strain on the structure of channel 112 of the transistor $T_1$, but they are arranged differently. In particular, these means include a piezoelectric layer denoted 220 with a thickness and composition that may be similar or equal to those of the layer 120, but arranged differently with respect to transistor $T_1$ with respect to the piezoelectric layer 120.

Figure 1B:
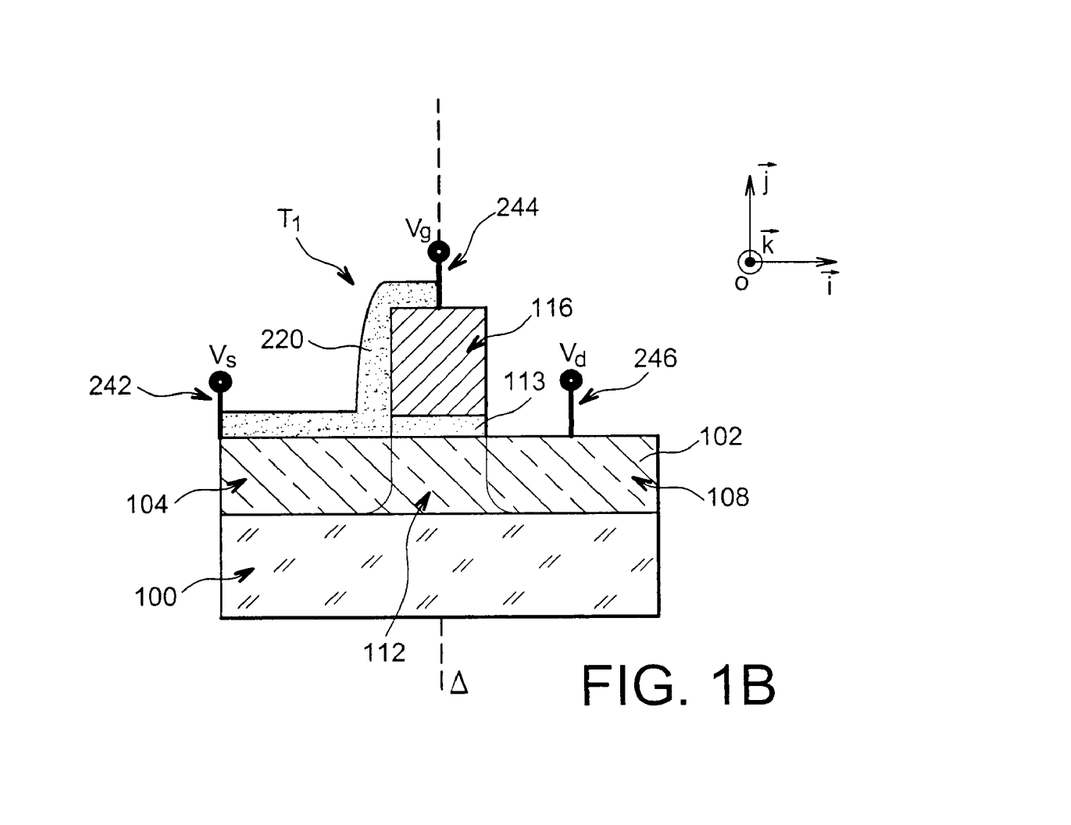

The piezoelectric layer 220 is dissymmetric about an axis Δ, orthogonal to a principal plane of the substrate (the principal plane of the substrate being defined as a plane passing through the substrate 100 and parallel to a plane $[0;\vec{i};\vec{k}]$ of the orthogonal coordinate system $[0;\vec{i};\vec{j};\vec{k}]$ in FIG. 1B) passing through the gate 116 of the transistor $T_1$.

The piezoelectric layer 220 may be dissymmetric about a plane perpendicular to a source-drain axis (defined in a direction parallel to a vector $\vec{i}$ of the orthogonal coordinate system $[0;\vec{i};\vec{j};\vec{k}]$ in FIG. 1B), and passing through the gate 116. The piezoelectric layer 220 is formed on at least one portion of the source region 104 and on a flank and a portion of the upper face or the top of the gate 116 of the transistor $T_1$ only. Another portion of the upper face of the gate 116, a flank of the gate 116 located on the side of the drain region 108, and the drain region 108, are not covered by the piezoelectric material-based layer 220.

Conducting pads 242, 244, 246, are also provided to electrically connect source bias means, gate bias means and drain bias means (not shown), to the source region 104, the gate 116 and the drain region 108 respectively, of the transistor $T_1$. Among the set of pads 242, 244, 246, pads 242 and 244 in contact with the source region 104 and the gate 116 respectively, are also in contact with the piezoelectric layer 220. The conducting pad 246 in contact with the drain region 108, is not in contact with this piezoelectric layer 220.

This particular arrangement or this dissymmetric distribution of the piezoelectric layer 220 with respect to the gate 116 of the transistor $T_1$, is used to distribute the mechanical strain that this layer 220 can apply on the transistor $T_1$, mainly at the <<input>> to the channel 112, while having no or little influence on the effective mass of charge carriers at the <<output>> from channel 112. <<Input>> means a zone of the channel 112 close to the source of transistor $T_1$, while <<output>> means a zone of the channel 112 close to the drain of transistor $T_1$.

For this variant, the stress induced by the piezoelectric layer 220 on the channel structure 112 is independent of the potential Vd applied on the drain 108, and is only modulated as a function of the value of potentials Vs, Vg applied by the bias means (not shown) of the source 104 and the gate 116 respectively of transistor 110.

The device can adopt at least a first bias state or a first set of values for the potentials Vs, Vg for which the piezoelectric layer 120 extends and applies or induces a first type of stress to the input to the channel 112 of the transistor $T_1$, for example a tension stress.

The device can also adopt at least a second bias state or a second set of values for the potentials Vs, Vg for which the piezoelectric layer 120 contracts or is compressed, and applies or induces a second type of stress at the input to the channel 112 of the transistor $T_1$, for example a compression stress.

For example, the piezoelectric layer 220 may have a piezoelectric constant of the order of $600*10^{-12}$ $m*V^{-1}$. Considering a potential Vg applied to the gate of the order of 1V or −1V, a relative deformation of the layer 220 of the order of $6*10^{-3}$ or a stress of about 1.5 GPa may be obtained.

The microelectronic device according to the invention is not limited to a single transistor $T_1$ and it may comprise a plurality of transistors, for example made using the CMOS technology, and covered by piezoelectric means such as those described above, capable of applying a stress with a variable nature and/or amplitude on the corresponding channels of these transistors.

FIGS. 2A, 2B, 2C and 2D illustrate operation of a microelectronic device using the CMOS technology, used according to the invention, provided with transistors $T_2$ et $T_3$, made using the NMOS and PMOS technologies respectively, and comprising a source region 204, 304, a drain region (not shown), a channel structure 212, 312, and a gate 216, 316, respectively. The structure of the channel 212, 312 may be based on at least one semiconducting material, for example based on at least one semiconducting material among the Si, Ge, SiGe, GaAs materials.

Like the transistor $T_1$ shown in FIG. 1B, the transistors $T_2$ and $T_3$ also support piezoelectric type means like those described above capable of applying a mechanical strain on the channel 212, 312, with a variable nature and/or amplitude. These means comprise a piezoelectric layer 220 on their source region and on a portion of their gate respectively, capable of being deformed when it is biased and adopting several positions depending on the value of the bias potentials applied to it. The piezoelectric means used according to the invention are capable of improving the performances of the NMOS and PMOS transistors.

Figure 2A:
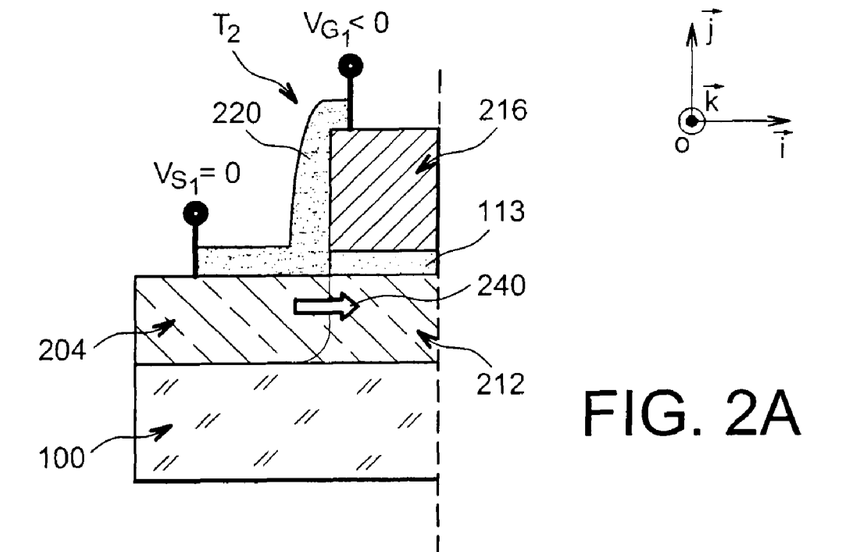
FIGS. 2A, 2B, 2C and 2D show different operating modes of a device according to the invention.
Figure 2B:
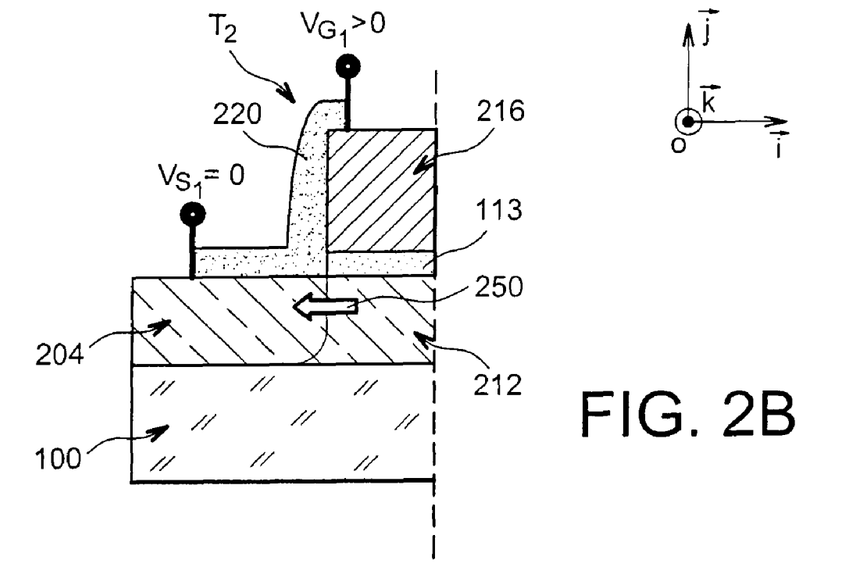
Figure 2C:
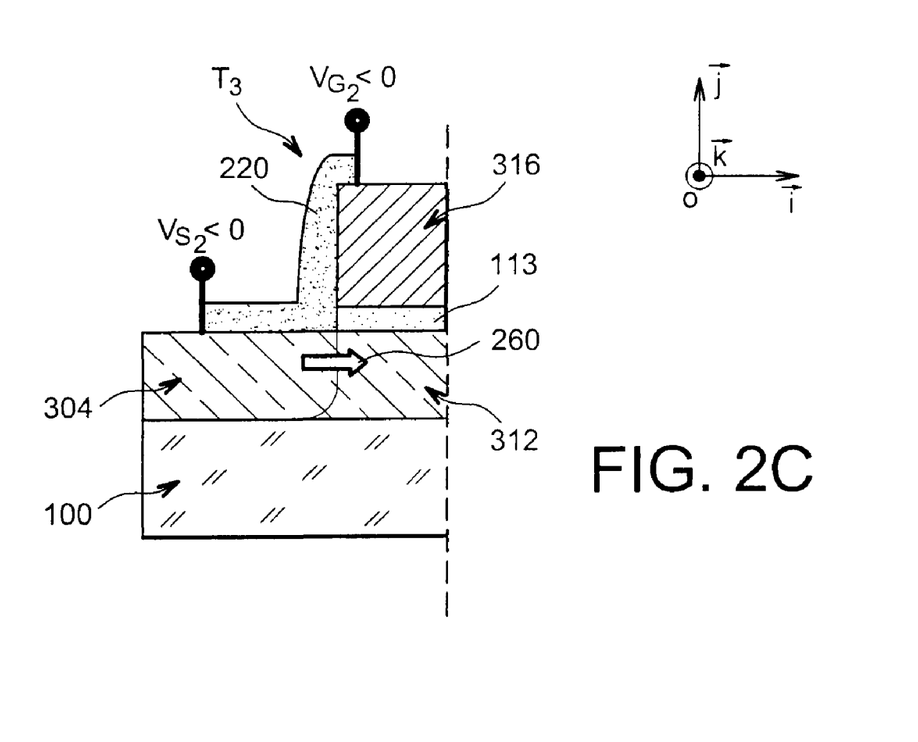
Figure 2D:
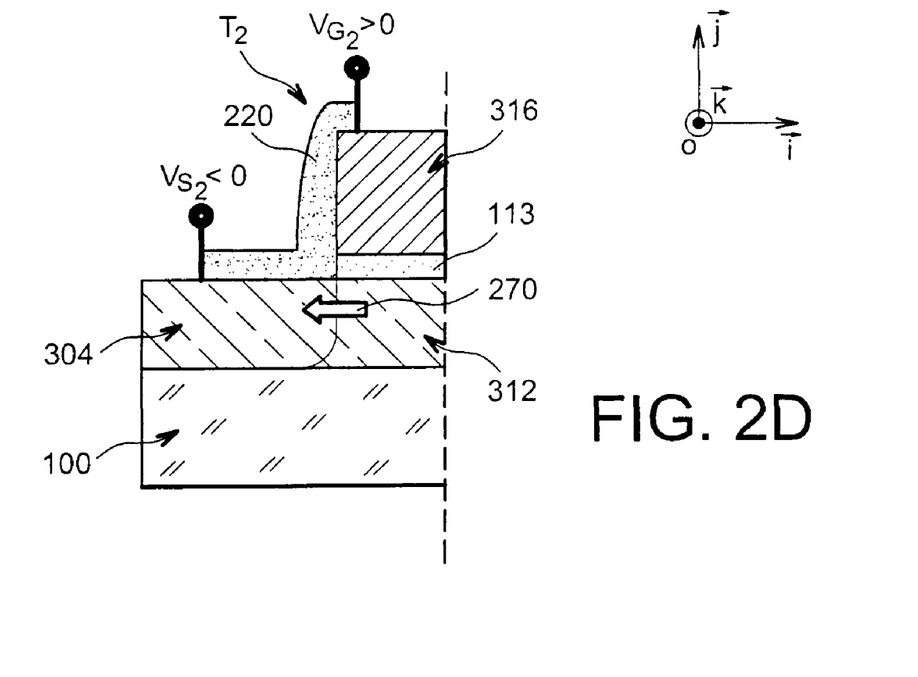

During an operating phase of the device, a potential Vg1 and a potential Vs1 respectively are applied to the gate 216 and to the source 204 respectively of the transistor $T_2$ made using an NMOS technology, such that Vg1−Vs1<Vt, where Vt is a voltage value for which the piezoelectric layer changes from a first stress state, for example a compression stress, to a second stress state, for example a tension stress, where Vt may for example be the threshold voltage of the transistor $T_2$.

During this operating phase of the device, the potential Vg1 and the potential Vs1 may for example be such that Vg1<0 and Vs1=0, the transistor $T_2$ then being put into an <<OFF>> or non-conducting state (FIG. 2A). The potentials Vg1 and Vs1 are also applied to the piezoelectric layer 220 associated with the transistor $T_2$. This layer tends to be compressed and then induces a uniaxial compression stress 240 (for which the direction and sense are similar to those of the vector $\vec{i}$ of an orthogonal coordinate system $[0;\vec{i};\vec{j};\vec{k}]$ defined in FIG. 2A), at the input or in a zone of the channel 212 close to the source 204 of the transistor $T_2$, this stress being unfavourable to transport of electrons in the channel 212. During this operating phase, the stress 240 applied on the channel 212 can be used to increase the effective mass of electrons in the channel 212 and to limit the leakage current.

During another operating phase of the device, a potential Vg1 and a potential Vs1 are applied to the gate 216 and the source 204 respectively of the transistor $T_2$, such that Vg1−Vs1>Vt. During this other operating phase of the device, the applied potentials Vg1 and Vs1 may for example be such that Vg1>0 and Vs1=0, the transistor $T_2$ then being in an <<ON>> or conducting state (FIG. 2B). the piezoelectric layer 220 associated with the transistor $T_2$ tends to extend and induces a uniaxial tension stress 250 at the input to the channel 212 (the direction of which is similar to the direction of the vector $\vec{i}$ of the orthogonal coordinate system $[0;\vec{i};\vec{j};\vec{k}]$, and the sense of which is opposite to the sense of the vector $\vec{i}$ of an orthogonal coordinate system $[0;\vec{i};\vec{j};\vec{k}]$ defined in FIG. 2B), this stress being favourable to the transport of electrons. During this other operating phase, the stress 250 applied to the channel 212 improves or increases the saturation current in the channel 212.

During one operating phase of the device (FIG. 2C), a potential Vg2 and a potential Vs2 are applied to the gate 316 and to the source 304 respectively of the transistor $T_3$ made using the PMOS technology, such that Vg2−Vs2<Vt. During this operating phase of the device, the potentials Vg2 and Vs2 may for example be such that Vg2<0 and Vs2=0, the transistor $T_3$ then being put into a so-called <<ON>> or conducting state. The piezoelectric layer associated with the transistor $T_3$, tends to compress and to induce a stress 260 (the direction and sense of which are similar to the direction and sense of the vector $\vec{i}$ of an orthogonal coordinate system $[0;\vec{i};\vec{j};\vec{k}]$ defined in FIG. 2C) in uniaxial compression at the input to the channel 312, this stress being favourable to the transport of holes. During this operating phase, the stress 260 reduces the effective mass of the holes and increases the saturation current in the channel 312.

During another operating phase of the device (FIG. 2D), a potential Vg2 and a potential Vs2 are applied to the gate 316 and to the source 304 respectively of the transistor $T_3$ made using the PMOS technology. During this other operating phase of the device, the potentials Vg2 and Vs2 may for example be such that Vg2>0 such that Vs2=0, the transistor $T_3$ then being put into a so-called <<OFF>> or non-conducting state. The piezoelectric layer 220 associated with the transistor $T_3$ induces a uniaxial compression stress at the input to the channel 312 (the direction of which is similar to the direction of the vector $\vec{i}$ of an orthogonal coordinate system $[0;\vec{i};\vec{j};\vec{k}]$, and the sense of which is opposite to the sense of the vector $\vec{i}$ of an orthogonal coordinate system $[0;\vec{i};\vec{j};\vec{k}]$ defined in FIG. 2B), this stress being unfavourable to the transport of holes. During this operating phase, the stress 270 increases the effective mass of the holes and reduces the leakage current. Transistors $T_2$ and $T_3$ may be integrated into the same substrate 100. According to one variant, the transistors $T_2$ and $T_3$ may possibly be controlled by the same potential.

Any of the microelectronic devices mentioned above with reference to FIGS. 1A, 1B, 2A-2D, may be used in a DRAM (dynamic random access memory). A dynamic random access memory comprising a plurality of cells provided with at least one dynamic memory write transistor associated with piezoelectric means as described above according to the invention, capable of applying a mechanical strain with a variable nature and/or amplitude on its channel, has better performances in terms of speed and consumption. The piezoelectric means associated with a write transistor of such a device are capable of applying a first type of stress onto the transistor channel, so as to increase the transistor saturation current and particularly to increase the speed at which the transistor writes information, for example in a storage capacitor with which this transistor is associated. These piezoelectric means can apply a second type of stress onto the transistor channel to reduce the transistor leakage current and particularly to prevent writing parasite or incorrect information, or to better protect information contained in the storage capacitor.

The device according to the invention is no longer limited to a semiconductor on insulator type substrate, and it may for example be used on a solid semiconductor substrate.

Nor is the microelectronic device according to the invention limited to one or more <<conventional>> single gate transistors like $T_1$ described above, and it may include more than one transistor, for example one or several double gate transistors and/or one or several so-called <<Finfet>> transistors like those described in document [1]: <<Sub 50 nm FinFET: PMOS>>, Huang et al., 1999 IEEE, and/or one or several so-called <<trigate>> transistors with three gates like those described in document [2]: <<Tri-Gate Fully Depleted CMOS Transistors: Fabrication, Design and Layout>>, B. Doyle et al., 2003 Symposium on VLSI Technology Digest of Technical Papers, and/or one or several Gate All Around>> (GAA) transistors like those described in document [3]: <<50 nm—Gate All Around (GAA)—Silicon On Nothing (SON)—Devices: A Simple Way to co-integration of GAA Transistors within bulk MOSFET method>>, Monfray et al., 2002 Symposium On VLSI Technology Digest Papers, including means, and particularly piezoelectric means, capable of applying a mechanical strain on their channel with a variable type and/or amplitude.

An example of the method according to the invention for making a microelectronic device of the type described above with reference to FIG. 1A, will now be presented with reference to FIGS. 3A to 3F.

The initial material used in the method may be a substrate formed from a massive semiconducting material layer or a semiconductor on insulator type substrate 100 comprising a first support layer that may be semiconducting and for example based on silicon, on which an insulating layer is supported, for example a silicon oxide (buried oxide) layer based on $SiO_2$, itself covered by a semiconducting layer 102 that can be used as an active layer, and for example based on Si or Ge or SiGe or an III-V compound such as AsGa, or a compound II-VI such as Hg—Cd or Hg—Te.

Figure 3A:
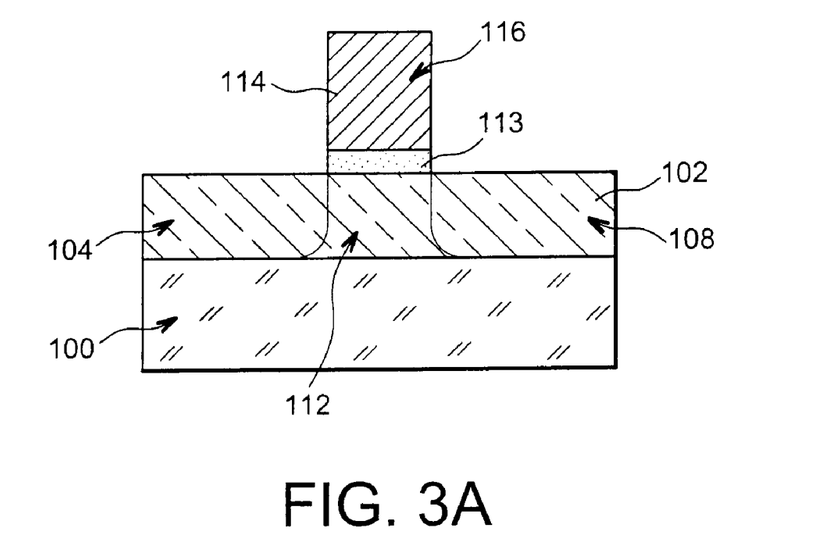
FIGS. 3A to 3D show a sectional view of the steps of an example embodiment of a microelectronic device according to the invention.

Then, at least one transistor is formed starting from the semiconducting layer 102 of the substrate 100, for example using the MOS technology, provided with at least one source region 104, at least one drain region 108, at least one channel structure 112 connecting the source and the drain, and at least one gate 116 to control conduction of the channel 112. To do this, at least one active zone can be defined in the semiconducting layer 102, for example by means for successive doping and masking steps. For example, the channel 112 may be formed from a zone or a P doped island in the semiconducting layer 102 for an NMOS transistor, or an N-doped island in the semiconducting layer 102 for a PMOS type transistor. The source region 104 and the drain region 108 may for example be formed from N doped zones in the semiconducting layer 102 on each side of a P doped island for an NMOS transistor, or formed from P doped zones on each side of an N doped island for an NMOS transistor. At least one gate 112 may be made on said active zone. This gate 112 may for example be formed by deposition of a dielectric gate layer material 113 or by oxidation of a semiconducting material, so as to form a gate dielectric material 113. The gate dielectric material 113 may for example be based on $SiO_2$, or $HfO_2$, or $HfSi_xO_y$. A metallic layer of gate material 114 is then deposited, for example such as TiN, or W, or $WSi_x$, or TaN, or a semiconducting material for example such as polysilicon, followed by etching of the gate material 114 and the gate dielectric 113 through a mask (FIG. 3A).

Figure 3B:
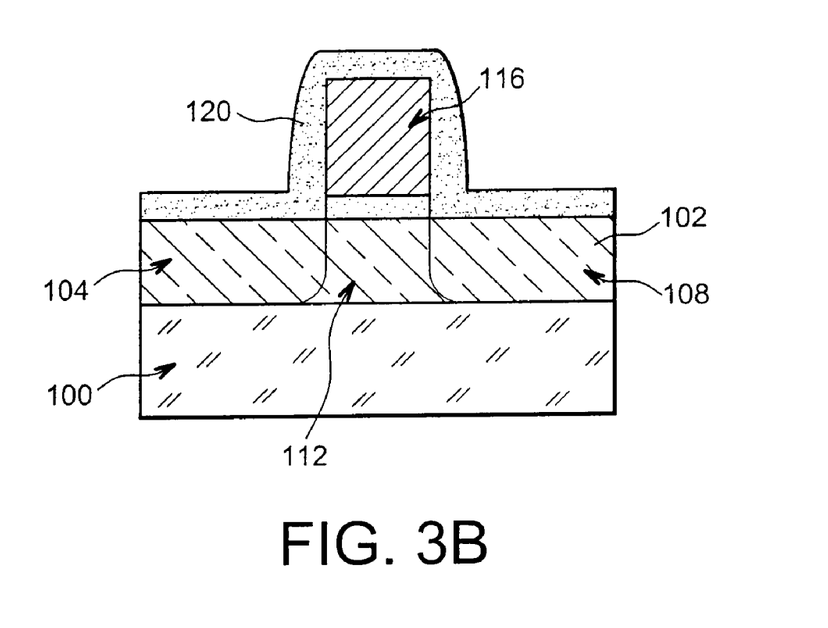

Once the source region 104, the drain region 108, the channel region 112 and the gate region 116 of the transistor have been formed, a layer 120 based on piezoelectric material 119, for example $PbZrTiO_3$ or PZT (lead-zirconate-titanate) or $BaSrTiO_3$ or BST (barium strontium titanate), or ZnO or $LiNbO_3$, can be deposited on at least one portion of the active zone and the gate 116. The layer 120 based on the piezoelectric material 119 such as PZT may be deposited for example, by sputtering in an RF magnetron type reactor.

The deposited piezoelectric material-based layer 120 is preferably thinner than the dielectric layers usually used in microelectronic devices to isolate two layers of metals from each other, for example with a thickness of less than 1 micrometer. The piezoelectric material-based layer 120 may for example be between 1 nanometer and one micrometer thick, or for example between 5 nanometers and 300 nanometers thick.

The layer of piezoelectric material may be continuous and it may be formed so as to cover the upper face and the flanks or side faces of the gate 116 of the transistor, and the active zone, and particularly the source region 104 and the drain region 108 of the semiconducting layer 102 (FIG. 3B).

The layer 120 may then possibly be etched between the different active zones.

Figure 3C:
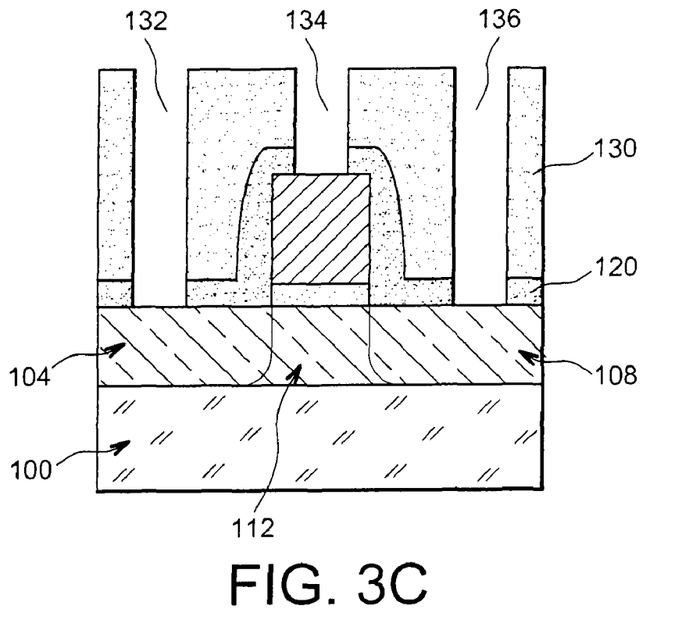

The next step is to deposit an insulating layer 130, for example based on $SiO_2$ above the piezoelectric material-based layer 120. This insulating layer 130 may be between 0.2 μm and 1.5 μm thick, for example of the order of 0.8 μm.

Then, openings 132, 134, 136 are made through the insulating layer 130 and the piezoelectric layer 120, exposing the source region 104, the gate 116 and the drain region 108 respectively. These openings 132, 134, 136 may for example be made by formation of a mask (not shown) on the insulating layer 130, followed by etching of the insulating layer 130 and the layer 120 through said mask, for example using a fluorocarbonaceous gas or wet etching using HF or HCl.

Figure 3D:
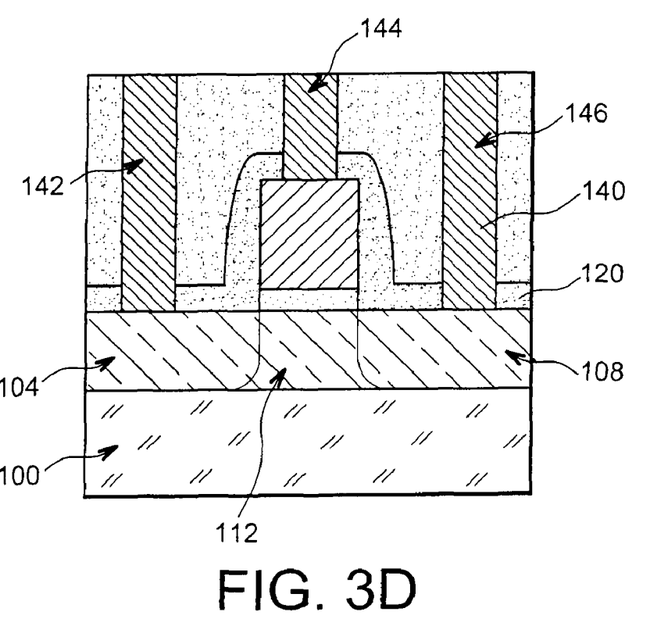

Subsequently, the openings 132, 134, 136 are filled using a conducting material 140, for example based on tungsten or aluminium, so as to form conducting pads 142, 144, 146, firstly in contact with the source region 104, the drain region 108 and the gate 116 respectively of the transistor, and secondly in contact with the piezoelectric layer 120.

The conducting pads 142, 144, 146 will electrically or mechanically connect the source regions 104, the drain regions 108 and the gates 116 of the transistors with the corresponding means for applying bias to the source region 104, the gate 116 and the drain region 108 respectively.

Figure 4A:
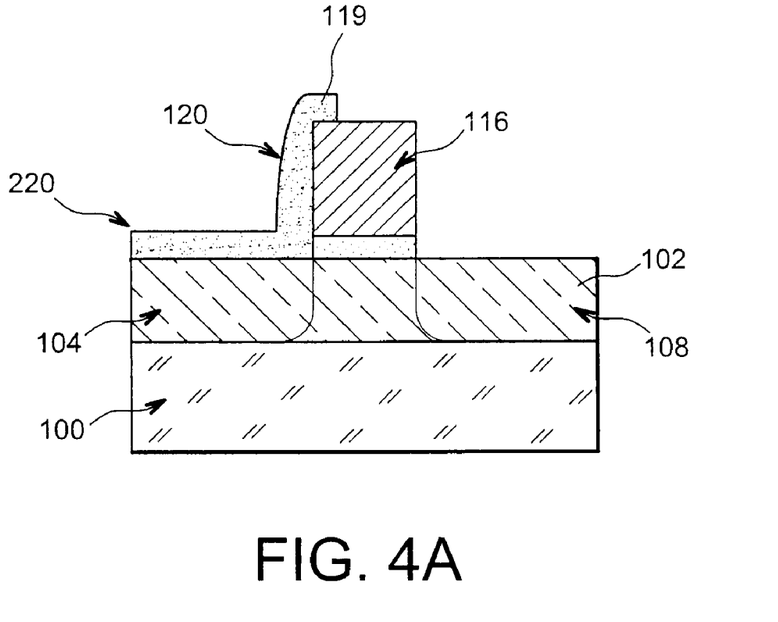
FIGS. 4A to 4B show a sectional view of the steps in another example embodiment of a microelectronic device according to the invention.

A variant of the example embodiment mentioned above used to implement a device of the type described above with reference to FIG. 1B, includes the formation of a layer 220 of piezoelectric material 119 after the source region 104, the drain region 8 and the gate region 116 have been formed, solely on the source region 104 or on a portion of the source region 104, and on the gate 116 or on a portion of the gate 116.

To achieve this, for example after the step to deposit a piezoelectric material 119 described above with reference to FIG. 3B, this latter material may be removed from zones facing or above the drain region 108, and preferably over the entire drain region 108. The piezoelectric material 119 may also be removed from a side flank of the gate 116 located adjacent to the drain region, and on a portion of the upper face of the gate 116.

This removal of the piezoelectric material 119 may for example include the production of a mask (not shown) protecting the source region 108, and a side flank of the gate 116, located on the side of the source region 108 and a portion of the upper face of the gate 116 extending along this flank, followed by etching of the piezoelectric material 119, for example wet etching based on HCl through the mask (FIG. 4A).

Figure 4B:
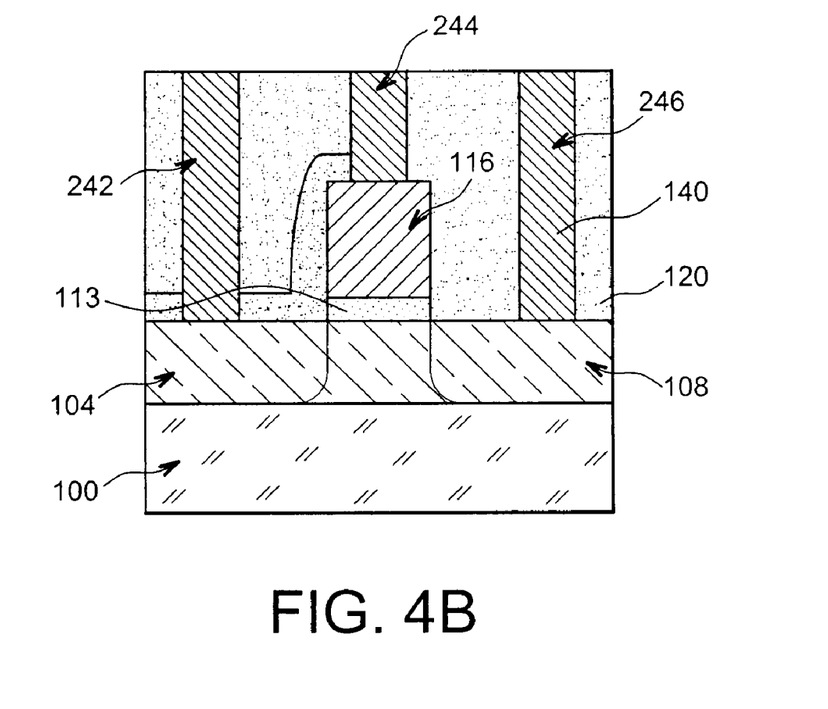

The next step is to deposit the insulating layer 130, and openings are then formed through this insulating layer exposing the source region 104, the gate 116 and the drain region 108 respectively.

Among the openings formed, only the openings exposing the source region 104 and the drain region 108 respectively also expose the piezoelectric layer 220.

The openings are then filled using a conducting material 140, for example based on tungsten and aluminium so as to form the conducting pads 242, 244 and 246 respectively.

Among the conducting pads 242, 244, 246, formed, the pads 242 and 244 in contact with the source region 104 and the gate 116 respectively are also in contact with the piezoelectric layer 220. The conducting pad 246 in contact with the drain region 108 is separate from or is not in contact with the piezoelectric layer 220.

The conducting pads 242, 244, 246 are designed to electrically or mechanically connect the source regions 104, the drain regions 108 and the gates 116 respectively of the transistors, to corresponding means for applying bias to the source region 104, the gate region 116 and the drain region 108 respectively.

According to one variant of any of the examples of the method described above, a step to form a thin intermediate layer on the active zone, for example an insulating layer, and particularly on the source region 104 and the drain region 108, may be performed prior to formation of the piezoelectric layer 120 or 220. According to this variant of the method, the next step is to form the piezoelectric layer on this thin intermediate insulating layer and above or facing at least one portion of the source region 104, and on at least one portion of the gate 116. The thin intermediate insulating layer may be made to attenuate the mechanical strain applied by the piezoelectric layer. The thin intermediate insulating layer may also act as an etching stop layer.

The method according to the invention is not limited to the formation of conventional transistor structures and may for example include the production of at least one double gate transistor and/or at least one so-called <<FinFet>> type transistor as described in document [1] (referenced above) and/or at least one so-called <<trigate>> transistor like that described in document [2] (referenced above), and/or at least Gate All Around transistor like that described in document [3]

(referenced above), in replacement of the step to produce the transistor(s) described with reference to FIG. 3A.

Then, the steps to form a piezoelectric layer 120 or 220 above at least one portion of the source region and at least one portion of the gate of one of these transistors, followed by the formation of conducting pads that will be connected to means for applying bias to the source region and to the piezoelectric layer respectively, and in contact firstly with the gate and the piezoelectric layer respectively and secondly with the source region and the piezoelectric layer, are then made.

Another example embodiment (not shown) forms at least one transistor on a substrate, provided with at least one source region and at least one drain region, and at least one semiconducting structure connecting the source region and the drain region, followed by production of at least one piezoelectric layer on the semiconducting structure, followed by a formation of at least one gate above the piezoelectric layer.

According to a first possibility, the gate may be formed on the piezoelectric layer so as to be in contact with this piezoelectric layer. According to this first possibility, the piezoelectric layer may be formed on a gate dielectric layer.

According to a second possibility, the piezoelectric layer may be formed on the semiconducting structure so as to be in contact with the semiconducting structure that will form a channel. According to this second possibility, the piezoelectric layer may be formed prior to deposit of a gate dielectric layer and a gate on the gate dielectric layer.

According to a third possibility, the piezoelectric layer may be made on the semiconducting structure. A gate is then formed on the piezoelectric layer. According to this third possibility, the piezoelectric layer may act as a gate dielectric.

According to a fourth possibility, the piezoelectric layer is based on at least one semiconducting material, and is formed on the semiconducting structure. According to this fourth possibility, the semiconducting structure and the piezoelectric layer are designed to form a channel for said transistor.

Figure 5:
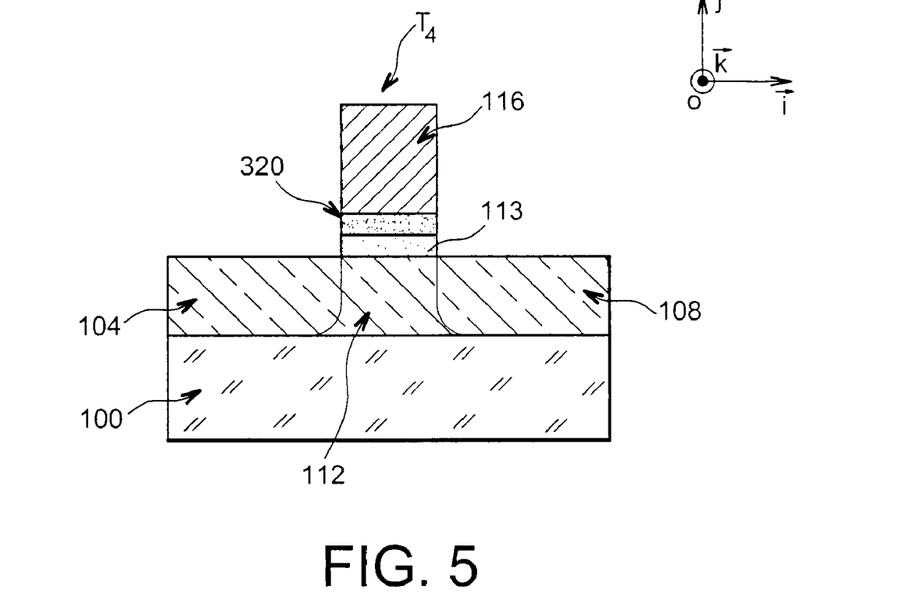
FIGS. 5, 6, 7 and 8 show variant microelectronic devices provided with at least one transistor and piezoelectric means capable of modulating the strained state of the channel of this transistor.

FIG. 5 shows another variant of the device also using piezoelectric type means for applying a variable mechanical strain on the channel structure 112 of a transistor $T_4$. The channel structure may be based on at least one semiconducting material, for example based on at least one semiconducting material among the Si, Ge, SiGe, GaAs materials. In particular, the piezoelectric means comprise a piezoelectric layer denoted 320, with a composition that may be similar to the composition of the layers 120 or 220, but arranged differently. For this variant, the piezoelectric layer 320 is located between the gate 116 of the transistor $T_4$ and the dielectric 113 of the gate 116 of this transistor. The piezoelectric layer 320 may be in contact both with the gate 116 and the dielectric 113 of the gate of transistor $T_4$.

Figure 6:
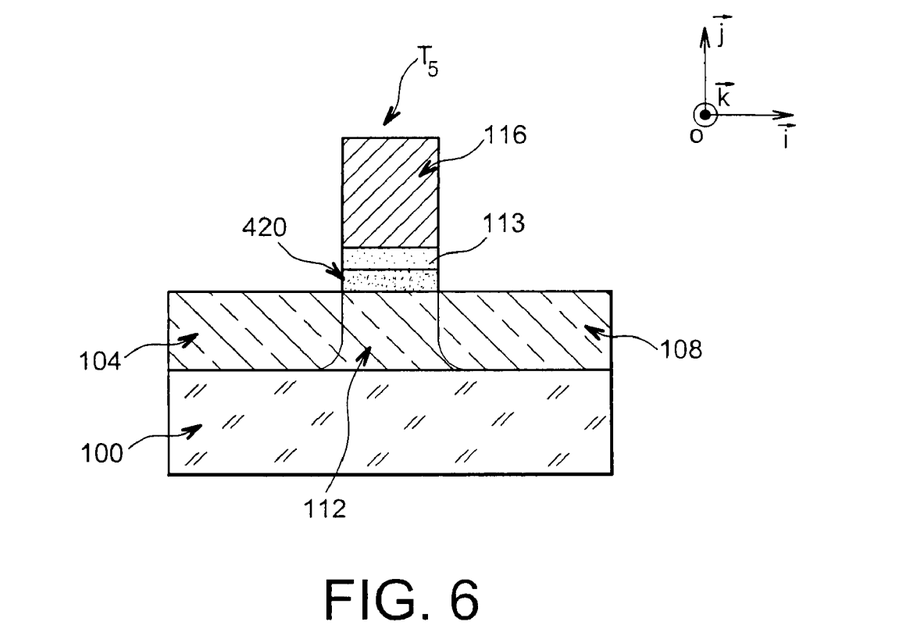

FIG. 6 shows another variant of the device also using piezoelectric type means for applying a variable mechanical strain on the structure of the channel 112 of a transistor $T_5$. The channel structure may be based on at least one semiconducting material, for example based on at least one semiconducting material among the Si, Ge, SiGe, GaAs materials. The piezoelectric means also include in particular a piezoelectric layer denoted 420 with a composition that may be similar to the composition of layers 120 or 220 or 320, but arranged differently. For this variant, the piezoelectric layer 420 is located between the dielectric 133 of the gate 116 of transistor $T_5$ and the channel 112 of this transistor. The piezoelectric layer 420 may be in contact both with the gate dielectric 113 and the channel 112 of the transistor $T_5$.

Figure 7:
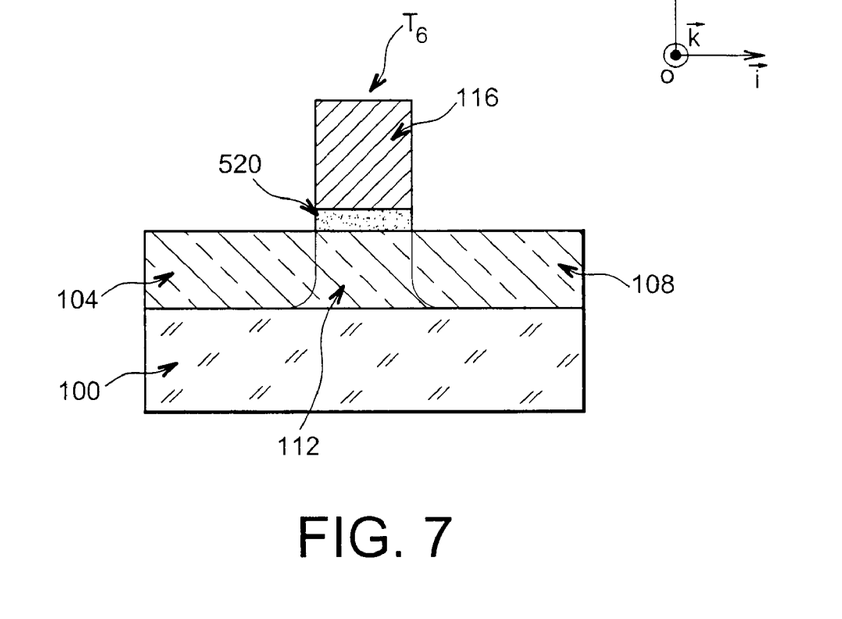

FIG. 7 shows another variant of the device also using piezoelectric type means for applying a variable mechanical strain on the structure of the channel 112 of a transistor $T_6$. These piezoelectric means include in particular a piezoelectric layer denoted 520, with a composition that may be similar to the composition of the layers 120 or 220 or 320 or 420 but arranged differently. For this variant, the piezoelectric layer 520 is located between the gate 116 of the transistor $T_6$ and the channel 112 of this transistor, and acts as a gate dielectric 116. The piezoelectric layer 520 may be in contact with the gate 116 and with the channel 112 of the transistor $T_6$.

Figure 8:
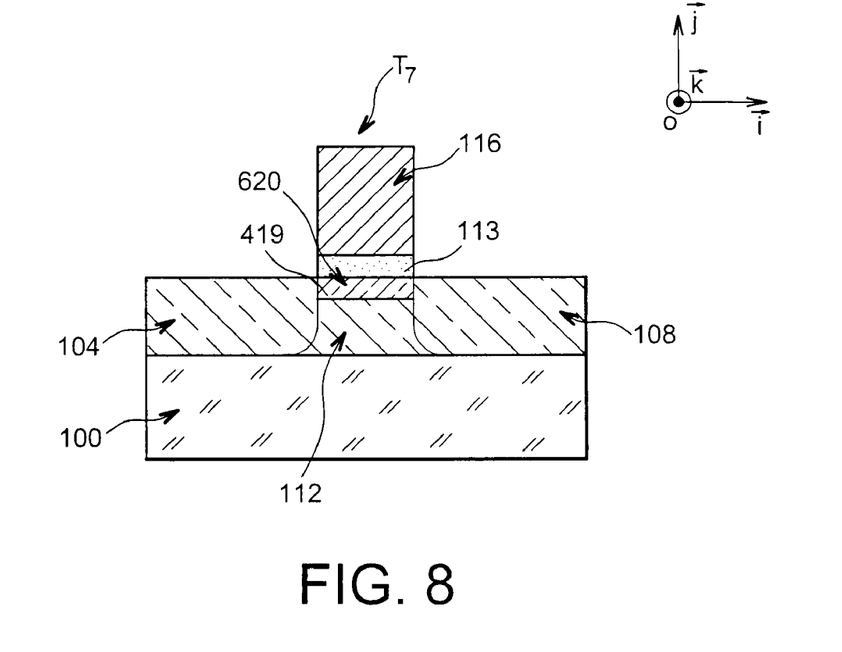

FIG. 8 shows another variant embodiment of the device also using piezoelectric type means for applying a variable mechanical strain onto the structure of the channel 112 of a transistor $T_7$. The structure of the channel 112 may be based on at least one semiconducting material, for example based on at least one semiconducting material among the Si, Ge, SiGe, GaAs materials. The piezoelectric means include in particular a piezoelectric layer denoted 620, with a composition that may be different from the composition of the layers 120 or 220 or 320, or 420, and arranged differently from the piezoelectric layers 120, 220, 320, 420, with respect to transistor $T_7$. For this variant, the piezoelectric layer 620 may be based on a semiconducting and piezoelectric material 419 such as AsGa. The piezoelectric layer 620 may also be located under the dielectric 113 of the gate 116 of transistor $T_7$ and may form part of the channel 112 of this transistor. The piezoelectric layer 720 may be in contact with the dielectric 113 of the gate 116 and may form part of the channel 112 of the transistor $T_7$.

The invention claimed is:

1. A microelectronic device comprising:
    a substrate;
    at least one first transistor including at least one source region, at least one drain region, at least one structure forming at least one channel connecting the source region and the drain region, and at least one gate;
    a piezoelectric layer including a piezoelectric material and supported on at least one portion of the at least one gate and above at least one portion of at least one of said source and/or drain regions, the piezoelectric layer at least partially contacting at least one flank of the at least one gate, and the piezoelectric layer inducing a mechanical strain or plural different types of mechanical strains on the at least one channel of the transistor;
    at least one first contact pad in contact with the source region and configured to be connected to a first bias source that applies a bias to the source region; and
    at least one second contact pad in contact with the at least one gate and configured to be connected to a second bias source that applies a bias to the at least one gate, the first contact pad and the second contact pad being in contact with the piezoelectric layer.

2. The microelectronic device according to claim 1, wherein the piezoelectric layer located above at least one portion of the source and supported on at least one portion of the at least one gate of the transistor.

3. The microelectronic device according to claim 2, the piezoelectric layer and the at least one portion of the source being separated by an intermediate insulating layer.

4. The microelectronic device according to claim 2, the piezoelectric layer and the at least one portion of the source being in contact.

5. The microelectronic device according to claim 2, the piezoelectric layer being dissymmetric about a normal to a principal plane of the substrate passing through the at least one gate.

6. The microelectronic device according to claim 2, further comprising at least a third contact pad configured to be connected to a third bias source that applies a bias to the drain region and separate from the piezoelectric layer.

7. The microelectronic device according to claim 2, further comprising:
   the second bias source that applies the bias to the at least one gate;
   the first bias source that applies the bias to the source region; and
   a third bias source that applies a bias to the drain region, the first bias source and the second bias source being electrically connected to the piezoelectric layer through the first contact pad and the second contact pad respectively.

8. The microelectronic device according to claim 1, in which the at least one first transistor is a PMOS transistor, and further comprising:
   at least one second NMOS transistor including at least one source region and at least one drain region respectively, formed in semiconducting zones of a substrate, at least one structure forming a channel connecting the source region and the drain region, and at least one gate supported on the channel; and
   a piezoelectric layer supported on at least one portion of the at least one gate and above at least one portion of at least one of said semiconducting zones, for inducing one or plural types of mechanical strains on the channel of the second transistor.

9. The microelectronic device according to claim 2, wherein the piezoelectric layer partially covers the at least one gate.

10. The microelectronic device according to claim 9, wherein the piezoelectric layer covers a flank of the at least one gate and a portion of an upper surface of the at least one gate.

11. A method for making a microelectronic device comprising:
    forming at least one first transistor on a substrate, including at least one source region, at least one drain region and at least one structure forming a channel, connecting the source region and the drain region, and at least one gate supported on the channel;
    forming one piezoelectric layer including a piezoelectric material above at least one portion of said source and/or drain regions and supported on at least one portion of the at least one gate of the at least one first transistor, the piezoelectric layer being formed to at least partially contact at least one flank of the at least one gate; and
    forming at least one first conducting pad in contact with the source region and the piezoelectric layer, and at least one second conducting pad in contact with the at least one gate and with the piezoelectric layer.

12. The method for making a microelectronic device according to claim 11, further comprising forming at least one third conducting pad in contact with the drain region and separate from the piezoelectric layer.

13. The method for making a microelectronic device according to claim 11, wherein the piezoelectric layer is formed to partially cover the at least one gate.

14. The method for making a microelectronic device according to claim 13, wherein the piezoelectric layer is formed to cover a flank of the at least one gate and a portion of an upper surface of the at least one gate.

15. A microelectronic device comprising:
    a substrate;
    at least one first transistor including at least one source region, at least one drain region, at least one structure forming at least one channel connecting the source region and the drain region, and at least one gate;
    piezoelectric means for inducing a mechanical strain or plural different types of mechanical strains on the at least one channel of the transistor;
    at least one first contact pad in contact with the source region and configured to be connected to means for applying bias to the source region; and
    at least one second contact pad in contact with the at least one gate and configured to be connected to means for applying bias to the at least one gate, the first contact pad and the second contact pad being in contact with the piezoelectric means, and the source region and the gate being in contact with the piezoelectric means.

* * * * *